United States Patent [19]
Carson et al.

[11] Patent Number: 5,347,428
[45] Date of Patent: Sep. 13, 1994

[54] MODULE COMPRISING IC MEMORY STACK DEDICATED TO AND STRUCTURALLY COMBINED WITH AN IC MICROPROCESSOR CHIP

[75] Inventors: John C. Carson, Corona del Mar; Ronald J. Indin, Huntington Beach; Stuart N. Shanken, Irvine, all of Calif.

[73] Assignee: Irvine Sensors Corporation, Costa Mesa, Calif.

[21] Appl. No.: 985,837

[22] Filed: Dec. 3, 1992

[51] Int. Cl.⁵ .............................................. H05K 7/02
[52] U.S. Cl. .................................... 361/760; 361/728; 361/807; 361/735; 174/260; 257/686
[58] Field of Search ............... 361/395, 393, 400, 401, 361/388, 417, 729, 735, 760, 761, 707, 728, 807; 174/52.4, 260; 257/678, 686, 723

[56] References Cited
U.S. PATENT DOCUMENTS

4,706,166  11/1987  Go .................................... 361/403
4,983,533  1/1991   Go .................................... 437/7
5,104,820  4/1992   Go .................................... 437/51

Primary Examiner—Leo P. Picard
Assistant Examiner—Young Whang
Attorney, Agent, or Firm—Thomas J. Plante

[57] ABSTRACT

A computer module is disclosed in which a stack of glued together IC memory chips is structurally integrated with a microprocessor chip. The memory provided by the stack is dedicated to the microprocessor chip. The microprocessor and its memory stack may be connected either by glue and/or by solder bumps. The solder bumps can perform three functions—electrical interconnection, mechanical connection, and heat transfer. The electrical connections in some versions are provided by wire bonding.

26 Claims, 10 Drawing Sheets

MODULE COMPRISING IC MEMORY STACK DEDICATED TO AND STRUCTURALLY COMBINED WITH AN IC MICROPROCESSOR CHIP

Certain claims in this application cover inventions which were made with Government support under Contract NAS7-1118, awarded by NASA JPL. The Government therefore has certain rights in those inventions.

BACKGROUND OF THE INVENTION

This invention relates to the field of dense electronic packaging, and particularly to packaging which obtains significant reductions in the distances traveled by the electronic signals.

Several patents and applications of the assignee of this application relate to the use of stacked IC (integrated circuit) chips which form memory modules usable in computer systems, e.g., U.S. Pat. Nos. 4,525,921; 4,646,128; 4,706,166 and 5,104,820; and applications Ser. Nos. 07/884,660 and 07/884,719.

This application deals with the systems in which such memory chip stacks are used. Memory devices, whether they are individual chips, or stacks of chips, must be mounted on a substrate which provides electrical leads connected to the memory circuitry. Also, the substrate must provide electrical leads extending to one or more computer (microprocessor) chips, whose memory needs are served by the memory chips. In other words, the microprocessor chips do not have the internal capacity to include substantial memory functions.

Figure 1:
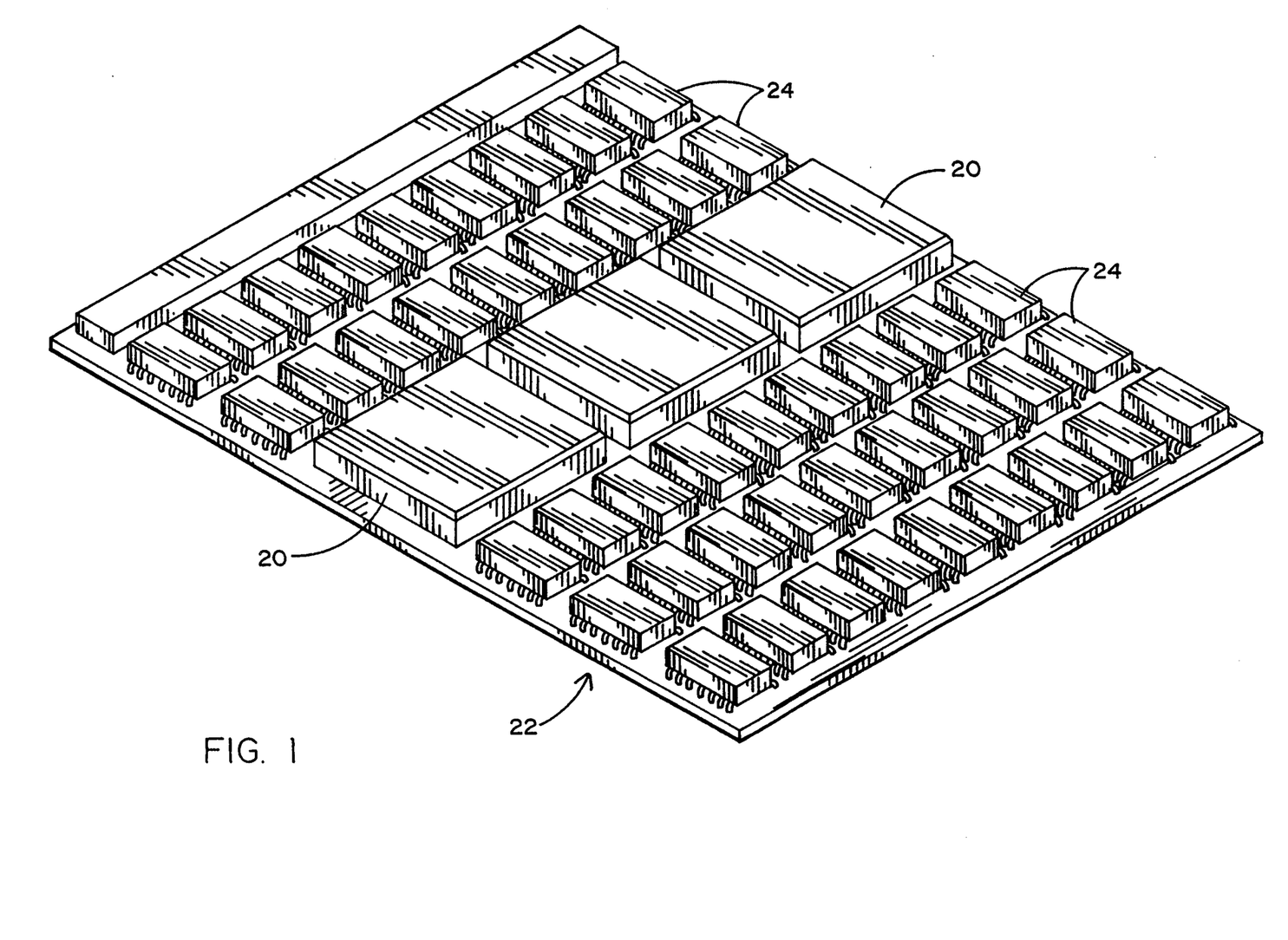
FIG. 1 is an isometric drawing showing an Intel iWARP microprocessor system mounted on a single PC board.
Figure 2:
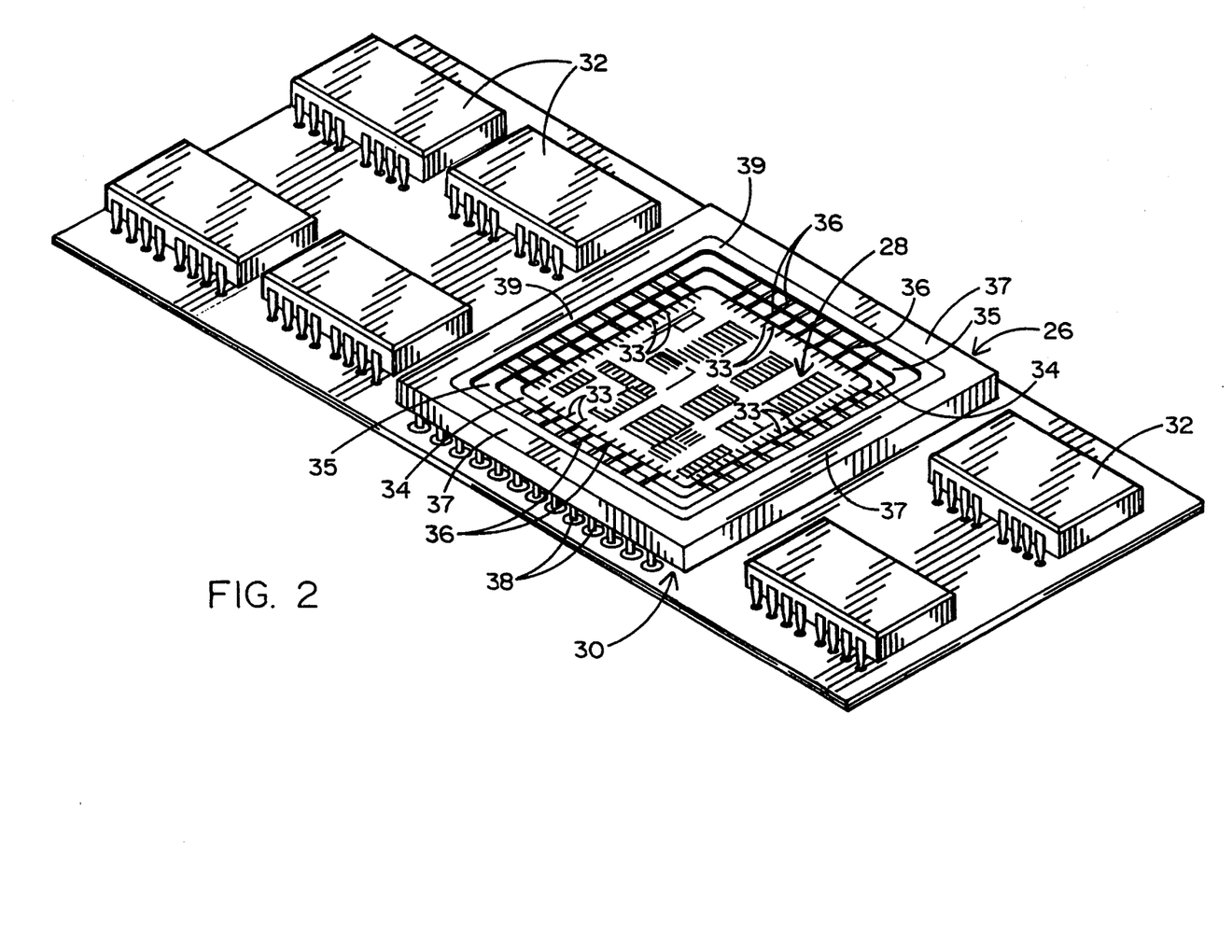
FIG. 2 is an isometric drawing showing an nCUBE microprocessor system mounted on a single PC board.

Packages which are advertised as state of the art microprocessor systems are illustrated in FIGS. 1 and 2 of this application. In each case a plurality of memory chips are located on the same PC board with one or more microprocessor chips.

Figure 4:
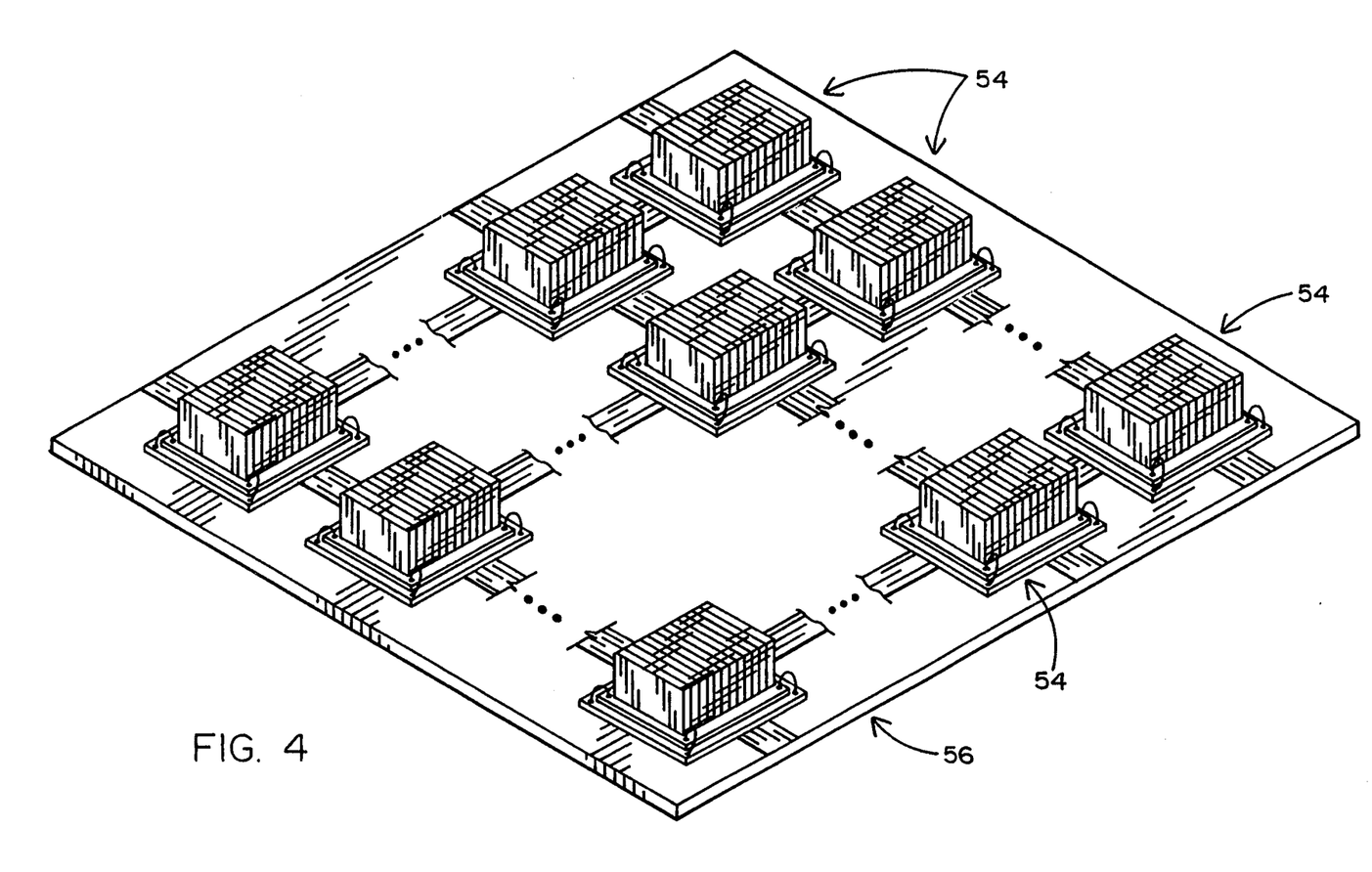
FIG. 4 is an isometric drawing showing a massively parallel computer system, in which a large number of the modules of FIG. 3 are mounted on a single PC board.

The present invention, as well as the systems illustrated in FIGS. 1 and 2, have been in part motivated by the need for a massively parallel, highly interconnected data processing system. Such a system requires a large number of microprocessors connected in parallel, and served by extensive memory systems. In FIG. 4 of this application, a structure is shown having many microprocessors connected in parallel, together with their supporting memory systems. The entire structure is contained in an area less than 1/16 of any such combination heretofore developed.

In attempting to solve the problem just discussed, a first path investigated was along the lines of the systems shown in FIGS. 1 and 2. On a ceramic substrate, a multiplicity of microprocessor chips and a multiplicity of memory devices were assembled in the most compact arrangements which could be designed.

A second path investigated was to use chip-stacking techniques of the type referred to above, which were originated by the assignee of this application. In such an approach, microprocessor chips and other chips, including memory chips, would be included in a single module as stacked layers of different sizes.

SUMMARY OF THE INVENTION

The solution of the problem has been the simple, but elegant, concept of structurally integrating each microprocessor IC chip with a stack of IC memory chips, whose memory function is dedicated to that microprocessor IC chip. The two are connected together to form an integrated microprocessor/memory combination.

Numerous specific architectures are available. The module of memory IC chips may be the type referred to as a "sliced bread" stack, in which the memory chips extend in planes perpendicular to the microprocessor on which they are mounted. Or the module of memory IC chips may be the type referred to as a "pancake" stack, in which the memory chips extend in planes parallel to the microprocessor on which they are mounted.

Either the "sliced bread" memory stack or the "pancake" memory stack may be electrically connected to the integrated microprocessor chip by use of wire bond connections, or by flip-chip connections. The flip-chip connections are functionally preferable, because they minimize the distances traveled by the electronic signals. The wire bond connections may be easier to manufacture, at least in some structures.

In some instances a lead-carrying intermediate layer may be mounted between the microprocessor chip and its memory stack. Some microprocessor chips contain internal memory interface circuitry; others will need to have such interface circuitry provided by a separate IC chip which can be included in the same stack as the memory chips.

The integrated microprocessor/memory stack permits the simplified manufacture of massively-parallel electronic systems, in which many microprocessor/memory stacks are mounted in proximity to one another on a single substrate.

Although a demand by NASA for "massively parallel on board information extraction systems" was instrumental in motivating the present invention, the value of the new concept is not limited to a system including numerous microprocessor-mounted memory chip stacks, but extends to any individual use of an integrated microprocessor chip/memory stack structure, an example of which is a "workstation".

Not only does the present invention dramatically reduce the space requirements of a microprocessor/memory combination. It also provides order of magnitude functional benefits, due to the reductions of signal travel distances. These reductions in travel distance permit lower capacitance, inductance, system noise, and power requirements; and increase speed and reliability. Furthermore, the complexity and cost of the electronic system are reduced.

DETAILED DESCRIPTION OF SPECIFIC EMBODIMENTS

FIG. 1 shows a highly sophisticated microprocessor/memory array made by Intel, which is referred to as iWARP. This array has three microprocessor chips, each in a package 20, which is mounted on a substrate (PC board) 22, which also carries numerous memory units 24. The memory units are electrically connected by conductors on substrate 22 to the microprocessor chips, and provide the memory functions required by the microprocessor chips. The area of the complete iWARP system shown is at least 5 times the area of the microprocessor chips.

FIG. 2 shows another highly sophisticated microprocessor/memory array, which is referred to as nCUBE. A microprocessor package 26 contains a microprocessor chip 28. Package 26 is mounted on a PC board 30, which also carries a plurality of memory units 32. The memory units are electrically connected by conductors on PC board 30 to the microprocessor chip 28, and they provide the memory functions required by the microprocessor chip. The area of the complete nCUBE system is at least 3–4 times the area of the microprocessor chip.

For future reference, it is useful to describe in greater detail the microprocessor chip 28 in FIG. 2. The figure shows the details of the upper surface of chip 28, including the numerous terminals 33, which are an integral part of chip 28, and which are located along all the edges of the chip 28. The total number of terminals 33 may be about 200; and the number of such terminals connected to the memory units 32 may be about one-third of the total. In order to connect terminals 33 to the memory units and to other exterior circuitry, two shelves 34 and 35 surround the microprocessor chip, and provide terminals 36 to which the terminals 33 are wire-bonded. The entire microprocessor package 26 is carried in a ceramic frame 37, which is supported by metal pins 38 plugged into sockets on PC board 30. A metal band 39 formed on the top of frame 37, surrounding the microprocessor chip 28 and the shelves 34 and 35, is used as a means of hermetically sealing the microprocessor. A cover (not shown) has a matching metal band which is soldered to metal band 39 to seal the microprocessor package.

While the dimensions in FIGS. 1 and 2 seem quite small, the PC board layouts are such that the signals traveling back and forth between each microprocessor and its memory chips cover distances which are significantly, and undesirably, long in terms of electronic processing efficiency. The length of the leads along which the microprocessor-to-memory signals travel will affect adversely not only complexity and cost. But, more importantly, longer distances traveled by the signals will adversely affect capacitance, inductance, system noise, power requirements, speed and reliability.

An aspect of the NASA project mentioned above was the desire to remove the limitations inherent in an iWARP system of the type shown in FIG. 1. A single iWARP microprocessor is assumed to be capable of 3.6 million connections/second. In an iWARP board of the type shown in FIG. 1, each microprocessor has the capability of addressing 24 megabytes of memory. This is the maximum memory that can be used due to the additive capacitance of the system.

The objective of the development which led to the present invention was to allow each iWARP microprocessor to address at least 64 megabytes of memory. At the same time, it was desired to attain a major reduction in volume and weight of the system.

The problem solution proposed by the present invention is integration of each microprocessor and its memory by mounting a stack of memory chips on the microprocessor which the memory serves. In order for this to work, the memory stack must have sufficient capability to effectively serve its microprocessor. Also, either the microprocessor itself must include circuitry which acts as an electronic interface between the microprocessor and its memory; or a chip must be incorporated in the microprocessor/memory integrated structure to act as the electronic interface.

Figure 3:
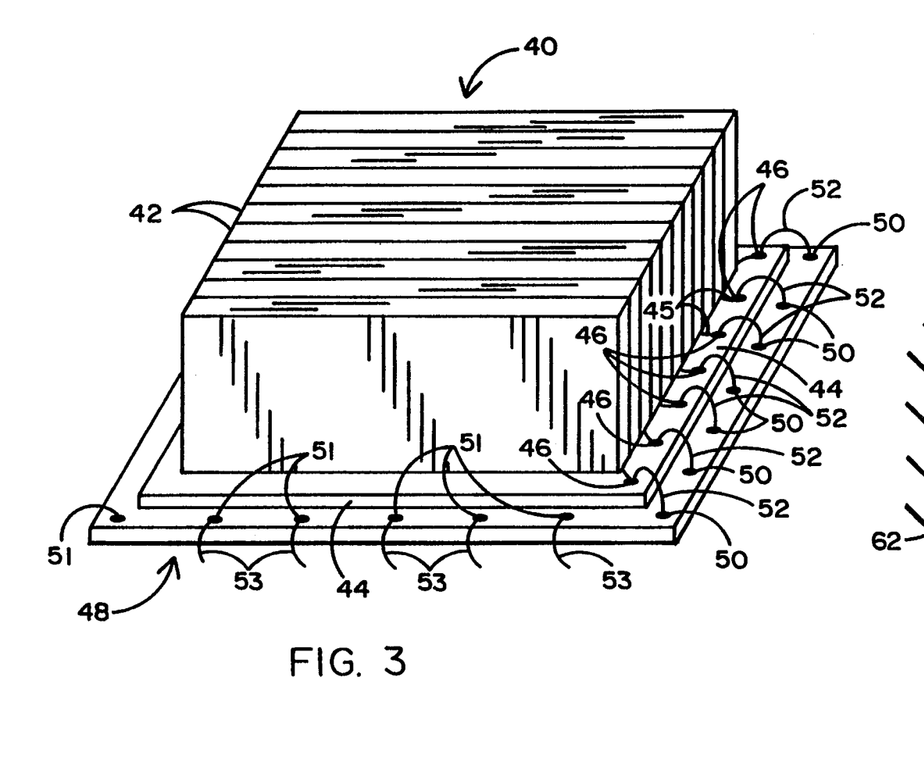
FIG. 3 is an isometric drawing showing a version of the present invention in which a memory chip stack is mounted on a substrate, which in turn is mounted on a microprocessor.

FIGS. 3 and 4 illustrate, in a very general way, applicant's proposed solution for the NASA problem of providing a massively parallel processor system containing a large number of microprocessors, each functioning as a node in the system. The solution is accomplished by putting a stack of memory IC chips in the "footprint" of each microprocessor, i.e., by mounting each memory stack on and connecting it to its associated microprocessor. The memory stack and the microprocessor combination are secured together by such means as solder connection or glue.

FIG. 3 shows one version of the memory stack/microprocessor combination, which is particularly easy to manufacture, using readily available components. A stack 40 of glued together silicon IC memory chips 42 is separately constructed, using techniques explained in the common assignee patents identified above. On the access plane face of the memory stack, which is its invisible lower side in FIG. 3, a substantial number of solder bumps are formed, individually mounted on terminals and/or buses formed on the access plane face.

A separate substrate layer 44 is formed having electrical traces 45 extending from terminals 46, located near the edges of substrate 44, to terminals on substrate 44 located under the access plane face of the stack 40, each terminal on the substrate being matched to an opposite terminal on the access plane of the stack. The stack and substrate are connected together by flip-chip bonding, or, if desired, by a new solder bonding technique explained in copending common assignee application Ser. No. 955,461, filed Oct. 2, 1992. The substrate 44, whose area is only slightly larger than that of memory stack 40, may be formed of silicon material covered by insulating material, or of a ceramic dielectric material, such as aluminum nitride. Aluminum nitride is a preferred ceramic, because it is an effective heat conductor, and because it has a thermal coefficient of expansion close to that of silicon.

The substrate/memory stack assembly is then glued to a microprocessor chip 48. Using memory interface terminals 50 (corresponding to some of the terminals 33 in FIG. 2), which have been pre-formed on the microprocessor to provide electrical access to the microprocessor's internal IC circuitry, the terminals 46 on substrate 44 are wire bonded (connected by wires 52) to the appropriate terminals 50 on the microprocessor. The total number of terminals on the microprocessor chip 48 may, as previously stated, be as high as 200, of which about one-third may be connected to the memory stack 40 via substrate 44. The other terminals 51 on the microprocessor chip are connected to external portions of the system by wire bonds 53.

FIG. 4 illustrates a massively parallel processor array containing a large number of the complete modules shown in FIG. 3. Each module 54 in FIG. 4 contains the entire assembly shown in FIG. 3. As an example of the tremendous benefits of the invention for a large system, FIG. 4 illustrates that 64 of the modules 54 can be mounted on a PC board 56, whose area dimensions are 15 cm×15 cm. Integration of all of the IC memory chips for each microprocessor within the "footprint" of that microprocessor increases by a factor of 10–20 the number of processing nodes which can be placed on a single circuit board. Therefore, numerous circuit boards can be eliminated from a system, gaining extensive benefits in speed increase and power reduction. Not only have order of magnitude improvements been obtained in size and weight reduction; the extent of power and speed enhancements have far exceeded the anticipated benefits.

The use of the substrate 44 in FIG. 3 between memory chip stack 42 and microprocessor chip 48 has, as previously stated, certain benefits from the standpoint of manufacturing simplicity. The numerous memeory-interface terminals 50 located along the edge of the microprocessor chip are in the normal positions provided by the supplier of the microprocessor chip, i.e., no manufacturing variations in the microprocessor chip are needed. Furthermore, the use of wire bonds 52 is a particularly simple way of electrically connecting the memory-interface terminals 50 on the microprocessor chip to the terminals 46 on substrate 44.

However, significant reductions in the signal travel distances can be obtained by omitting substrate 44, and flip-chip bonding the solder bumps on the bottom of memory chip stack 40 directly to matching solder bumps formed on the top surface of microprocessor chip 48. From a performance standpoint, that is the ideal arrangement.

Figure 5:
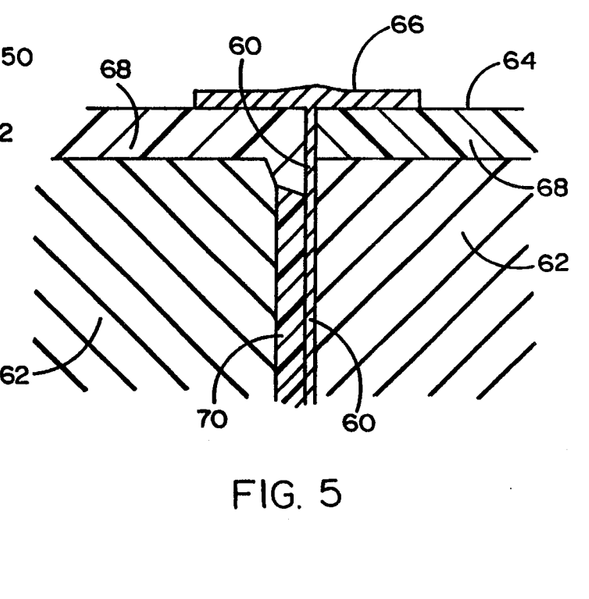
FIG. 5 is a cross-section through a T-connect which joins a lead line from the interior of a memory stack of IC chips to a terminal on the access plane surface of the memory stack.

It will be useful to explain in detail the path followed by signals traveling between leads on each memory chip and the microprocessor chip. FIG. 5, which is taken from common assignee application Ser. No. 884,719, shows one of many T-connects formed on the access plane of the memory chip stack. An electrical lead 60 extending from the IC circuitry in a chip 62 reaches the surface of the access plane 64, where it is joined to metallization 66, which may be a terminal pad or a bus, or a combination of pad and bus. The T-connect (lead 60 and terminal 66) provides an effective and reliable electrical contact. A passivation layer 68 lies between the access plane surface of the chips 62 and the metallization 66. This is necessary to avoid short-circuiting by the silicon semiconductor material of the chips. A layer 70 of adhesive material secures together the adjacent chips 62. Insulating material (not visible in the figure) is provided on each flat surface of each chip 62. The earlier town, on assignee patents referenced above deal with (a) the preparation of the chips for stacking, (b) the forming of the chips into a stack having adhesive material retaining the chips in the stack, and (c) the preparation of the access plane of the stack for metallization to create electrical communication with exterior circuitry. If desired, a stack of chips may have more than one access plane connected to exterior circuitry.

Figure 6:
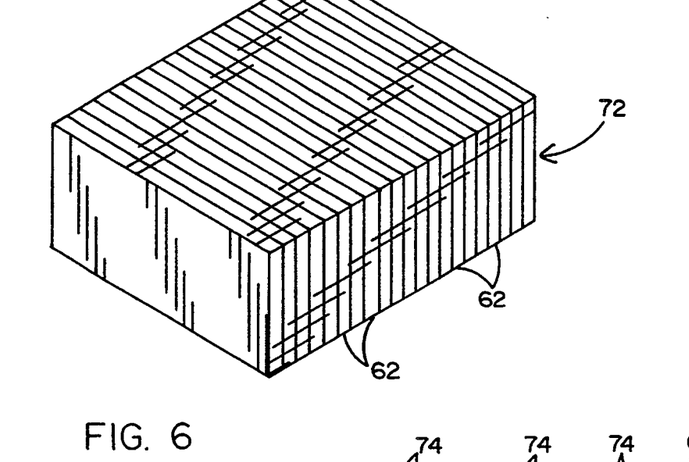
FIG. 6 is an isometric drawing showing a "sliced bread" memory stack prior to mounting on a substrate or on a microprocessor chip.
Figure 7:
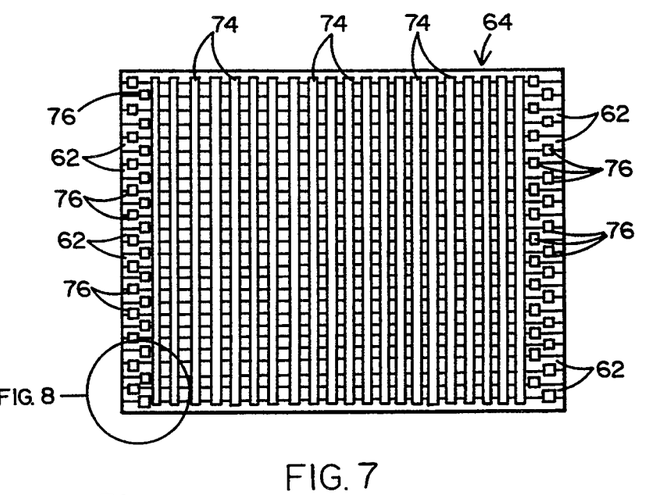
FIG. 7 is a plan view showing the metallization formed on the access plane of the memory stack in FIG. 6.

FIG. 6 shows a completed stack 72 of IC memory chips 62. The access plane 64, which is invisible in FIG. 6, is shown in detail in FIGS. 7 and 8. The extensive metallization pattern on the access plane is illustrated in those figures. A multiplicity of busses 74 extend across the entire stack of separate IC chips. The busses carry the memory address of the information to be retrieved. A signal transmitted to or from a given bus will pass along a lead 60 (FIG. 5) on each of the memory chips 62. In addition to the busses 74, which cross the entire stack, each chip in the stack has at least one terminal 76 which connects only to one chip. In FIG. 7, two sets of such single chip terminals are shown, one set at the left side of the figure, and one set at the right side of the figure. One set of the individual chip terminals 76 may be "chip enable" connections, which cause power to be present only on a selected one of the memory chips 62. The other set of individual chip terminals 76 may be used as "data line" connections, which connect to the appropriate chip 62 in order to provide data transfer. Note that the terminals 76 in FIG. 7 are the same as the T-connect terminal 66 in FIG. 5. Similar T-connect terminals are located under each of the busses 74 in FIG. 7, one such terminal being located at the lead-carrying surface of each IC memory chip 62.

Figure 8:
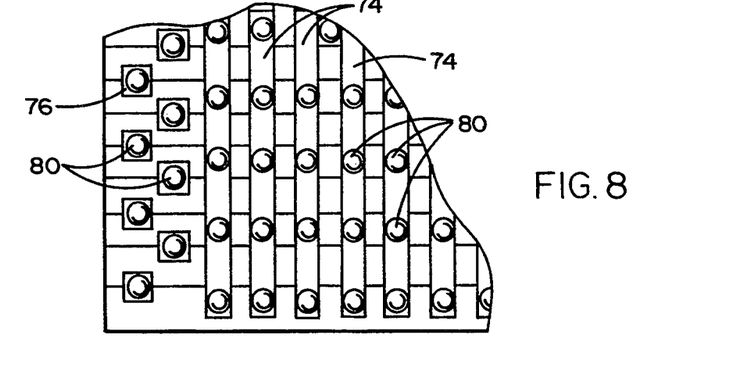
FIG. 8 is a close up of a small portion of FIG. 7, in which solder bumps have been formed on the buses and on the single chip terminals of the access plane.

FIG. 8 is a close up of a small portion of FIG. 7. It shows a multiplicity of solder bumps 80 formed on the access plane of the memory chip stack 72. A solder bump 80 is formed on each terminal 76. Also a large number of solder bumps 80 are formed on each bus 74. Most of the solder bumps 80 formed on buses 74 are unnecessary as electrical connections. But they are used to provide the mechanical interconnection between memory stack 72 and its substrate.

Figure 9:
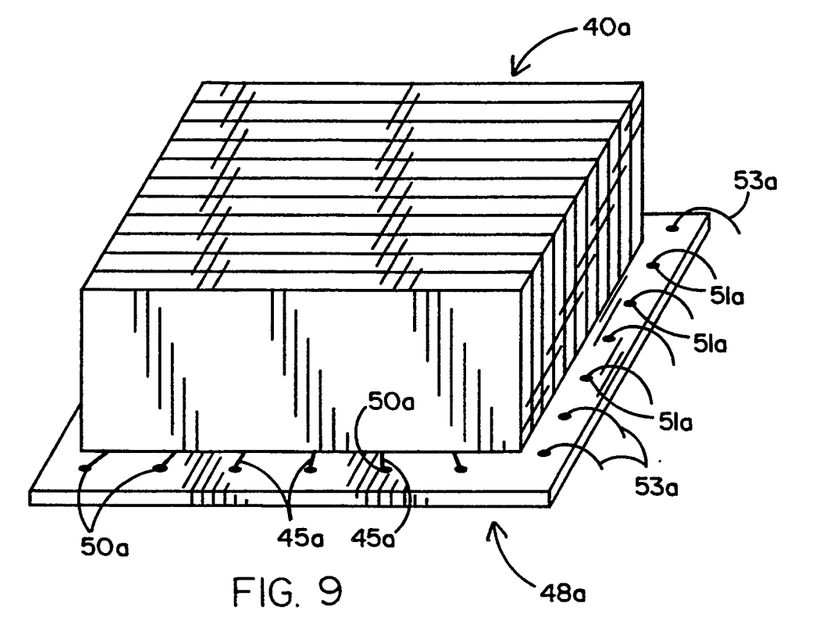
FIGS. 9 and 10, which are similar to FIG. 3, show "sliced bread" memory stacks which have been connected by solder bumps directly to the microprocessor chip.
Figure 10:
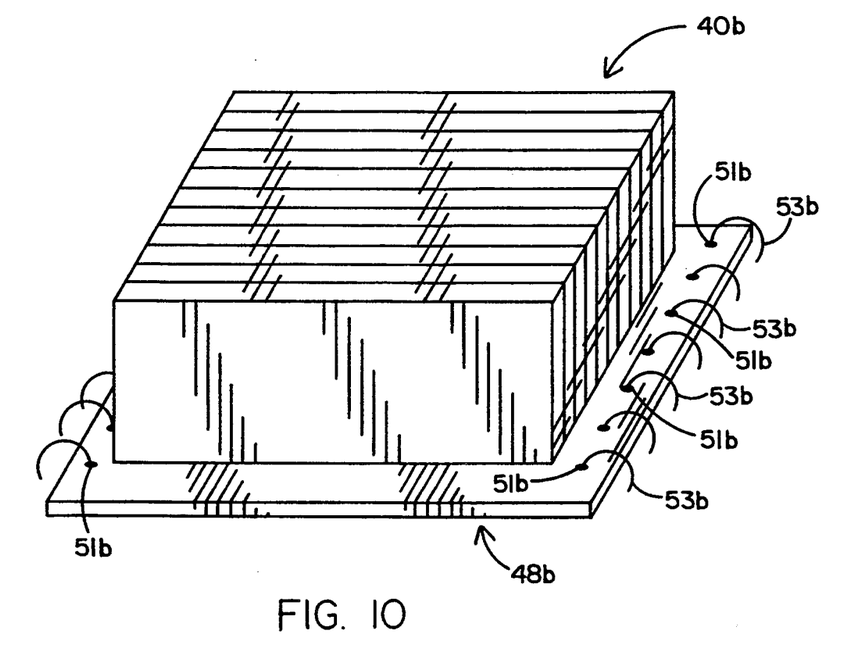

In FIGS. 9 and 10, which are similar to FIG. 3, the substrate between the memory stack and the microprocessor chip has been eliminated (substrate 44 in FIG. 3). In the structures of both FIGS. 9 and 10, the signal-carrying efficiency of the integrated microprocessor/-memory stack is increased in comparison to the structure of FIG. 3. In both FIGS. 9 and 10, the memory stack is soldered directly to the microprocessor chip. In FIG. 9, rerouting metallization is used to route the signals from the edge-located memory-interface terminals on the microprocessor chip to the appropriate terminals which are soldered to the solder bumps 80 on the access plane of the memory chip stack. In FIG. 10, the location of the memory interface terminals on the microprocessor chip has been changed in the design of the microprocessor, in order to prelocate them in alignment with the solder bumps on the access plane of the memory stack. As in FIG. 8, an excess of solder connections would be provided on the surface of the microprocessor chip, in order to provide the desired mechanical connection strength.

FIG. 9 shows the memory stack 40a secured directly to the microprocessor chip 48a, by means of solder bumps, which are formed on the access plane of the memory stack, as in FIG. 8. Aligned solder bumps or terminals (not shown) are formed on the top surface of microprocessor chip 48a. As previously explained, some of the solder bump connections are used solely to strengthen the mechanical connection between memory stack 40a and microprocessor chip 48a. In FIG. 9, the changes in microprocessor chip 48a are minimized, as compared to the structure of FIG. 3. The same memory-interface terminals 50a are provided, located along the edge of the microprocessor chip. The terminals 51a not associated with the memory are connected to exterior circuitry by wire bonds 53a. Those terminals 50a which interface with the memory stack are not wire-bonded, as in FIG. 3, but are connected by traces 45a directly to the appropriate terminals (not shown) which are aligned with corresponding terminals (solder bumps) on the access plane of the memory stack. Elimination of the substrate layer 44 of FIG. 3, and elimination of the wire bonds 52, reduces the distances traveled by the electrical signals between the microprocessor chip and the memory stack.

Further reduction of the distances traveled by the electrical signals between the microprocessor chip and the memory stack can be provided by the structure shown in FIG. 10. The microprocessor chip 48b has been so designed that its memory-interface terminals are located in alignment with the appropriate terminals on the access plane of the memory stack 40b. The terminals 51b along the edge of the microprocessor chip are used solely for connection by wire bonds 53b to exterior circuitry. Since none of the terminals 51b are connected to the memory stack, no traces similar to traces 45a in FIG. 9 are required. As in the FIG. 9 structure, solder bumps are used in the FIG. 10 structure to secure the memory stack 40b directly to the microprocessor chip 48b. The layout of busses 74, terminals 76 and solder bumps 80 shown in FIGS. 7 and 8 may be the same in each of the three memory stack/microprocessor chip combinations shown in FIGS. 3, 9 and 10.

Figure 11:
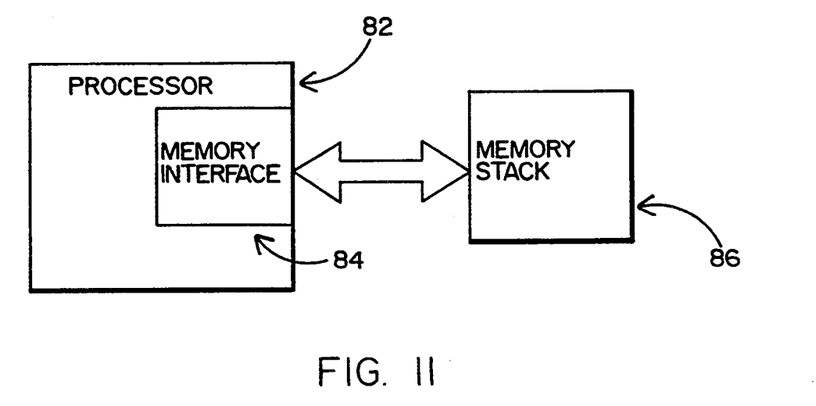
FIGS. 11 and 12 illustrate, respectively, the situations where the interface circuitry between the microprocessor on the memory is inside the microprocessor, and where it is on a chip included in the memory stack.
Figure 12:
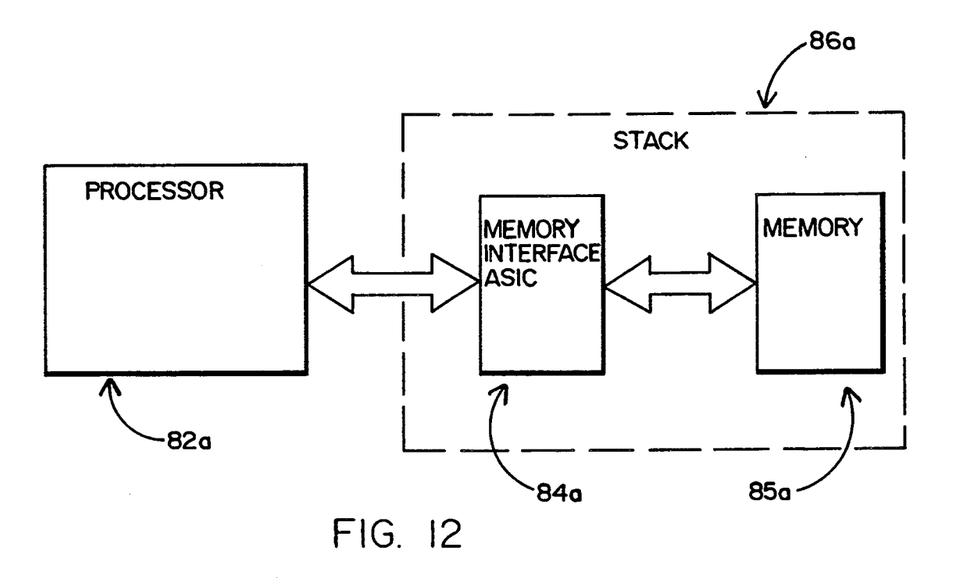

In the foregoing description, it has been assumed that the memory interface is part of the microprocessor circuitry. However, in some cases, where the interface circuitry is not part of the microprocessor, it may be supplied by a separate IC chip. Such an interface chip should be included in the stack of memory chips. FIGS. 11 and 12 illustrate diagrammatically the two interface options. In FIG. 11, the circuitry in microprocessor chip 82 includes a memory interface section 84, which is electrically connected to memory stack 86. In FIG. 12, the microprocessor chip 82a does not include the memory interface circuitry. Instead the memory stack whose chips are surrounded by the dashed line 86a, includes a memory interface ASIC chip 84a (application specific integrated circuit), as one of the stacked memory chips 85a.

Figure 13:
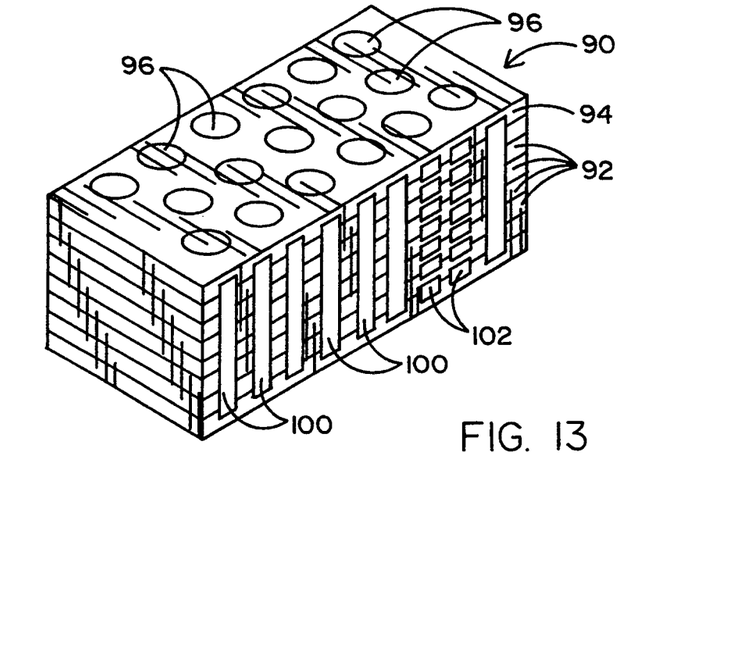
FIG. 13 is an isometric drawing showing a "pancake" stack similar to the one disclosed in common assignee application Ser. No. 07/884,660.

The "sliced bread" type of memory chip stack, shown in FIGS. 3, 9 and 10, is capable of providing the largest memory capability mounted on a given microprocessor chip, because of the large number of chips in the stack. There will, however, be many situations where a smaller number of stacked memory chips will suffice, and where a "pancake" type of stack is preferred. FIG. 13 shows a "pancake" stack 90 containing several active IC chip layers 92, plus an inactive top layer 94, whose purpose is to provide easily accessible terminals 96 which are used to connect the memory stack 90 to its microprocessor chip. As described in common assignee application Ser. No. 07/884,660, the top layer 94 is preferably formed of a dielectric (ceramic) material, such as aluminum nitride. The memory stack 90 has an access plane 98 on which buses 100 and individual terminals 102 have been formed, providing T-connects with the leads on chips 92 which extend to the access plane. As in the case of the "sliced bread" stack, whose access plane 64 is shown in FIG. 7, in FIG. 13 the buses 100 extend across the entire stack of IC chips; and each terminal 102 is part of a T-connect on a single IC chip.

The common assignee application identified in the preceding paragraph describes in detail the electrical connections from buses 100 and terminals 102 to the appropriate terminals 96 on the top of stack 90. Metallic traces formed on the underside of layer 94 extend from T-connects at the access plane to the holes formed in layer 94. Metal extending through each hole connects to one of the exterior terminals 96.

Figure 14:
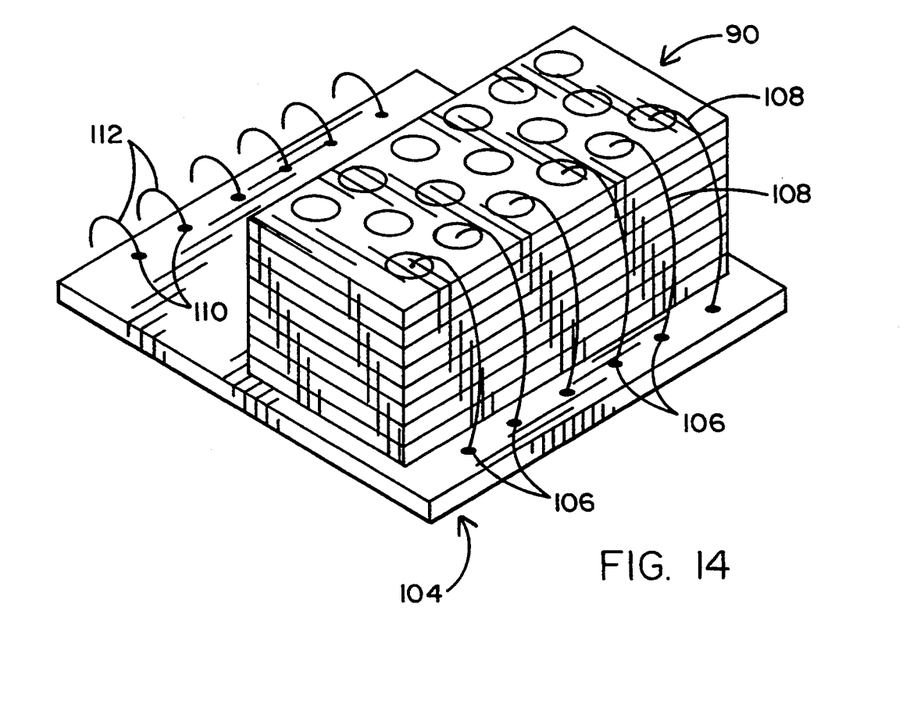
FIG. 14 shows the "pancake" stack of FIG. 13 mounted on a microprocessor, with terminals on the top of the stack wire-bonded to the memory-interface terminals on the microprocessor.

FIG. 14 shows the "pancake" stack 90 mounted on top of a microprocessor chip 104. The stack 90 is glued to the microprocessor 104, with a layer of insulating material between them. Along the edge of the microprocessor chip are a large number of terminals. Terminals 106 are memory-interface terminals, which are connected to the respective memory stack terminals 96 by wire bonds 108. Terminals 110 are connected by wire bonds 112 to exterior circuitry. This structure, like the structure in FIG. 3, is the simplest to manufacture, based on available components. However, the benefits of faster signal communication can be obtained by eliminating the wire bond connections between the memory stack and the microprocessor chip.

Figure 15:
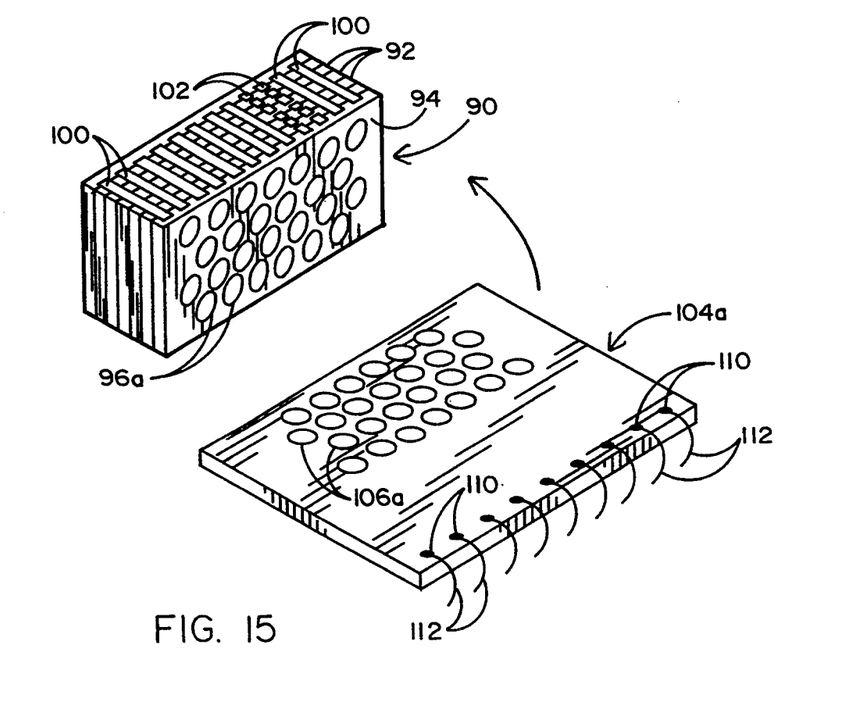
FIG. 15 shows the "pancake" stack of FIGS. 13 and 14 mounted "upside down" on the microprocessor, and secured thereto by solder bumps.

FIG. 15 shows how direct soldering of terminals on the memory stack and the microprocessor chip may be accomplished. The memory stack 90 has been turned upside down, as contrasted to FIGS. 13 and 14. Terminals 96a on memory stack 90 are aligned with matching memory-interface terminals 106a formed on microprocessor chip 104a. Solder bumps are formed on one or both of the facing surfaces; and the aligned terminals are securely connected together by causing the solder to flow and re-solidify.

Soldering of terminals on the memory stack 90 directly to terminals on the microprocessor chip 104a provides the same options as those discussed in describing FIGS. 9 and 10. The original edge-located memory-interface terminals on the microprocessor chip 104a may be connected by metallic traces to the appropriate soldered terminals 106a. Or the microprocessor chip 104a may be redesigned in such a way that its memory-interface terminals are in the locations of terminals 106a. The latter arrangement provides the maximum benefit in increasing the speed of communication between the microprocessor chip and its dedicated memory chip stack.

Various reasons might dictate the use of "pancake" stacks in preference to "sliced bread" stacks, in spite of their lower number of memory chips. In some cases, "headroom" may be a factor. In other cases, the amount of memory capacity of the "pancake" stack may be congruent with the requirements of its associated microprocessor chip. Another possibility is the use of the stack as a "cache" memory, i.e., a very high speed memory located very close to the microprocessor, which stores the memory data used most frequently by the microprocessor. When the microprocessor tries to go to memory, first to get data, or to get its next instruction, it first looks at its local cache memory, because it can do so at a much higher speed. Larger bulk memory is slower, so when the microprocessor looks for something, it looks first in the cache memory, and if the information is there it is used. If it's not there, a so called "cache-miss", then the microprocessor takes the extra time required to go out to the main memory and acquire the information. At the same time, it puts a copy of the information into its cache memory, so it can use it when it is next needed. The theory is that most memory accesses are local. If an item is accessed, it's likely to be accessed again frequently. In other words, there is a small loop in which the data needs to be looked at over and over. The basic concept of a cache memory is the idea of a speed hierarchy of memory.

The use of a dedicated, or local memory, as disclosed in this application, does eliminate the possibility of having several microprocessors share a single memory. But that is a minor sacrifice in comparison to the extensive benefits obtained. There are, however, certain concerns which have to be dealt with.

Figure 16:
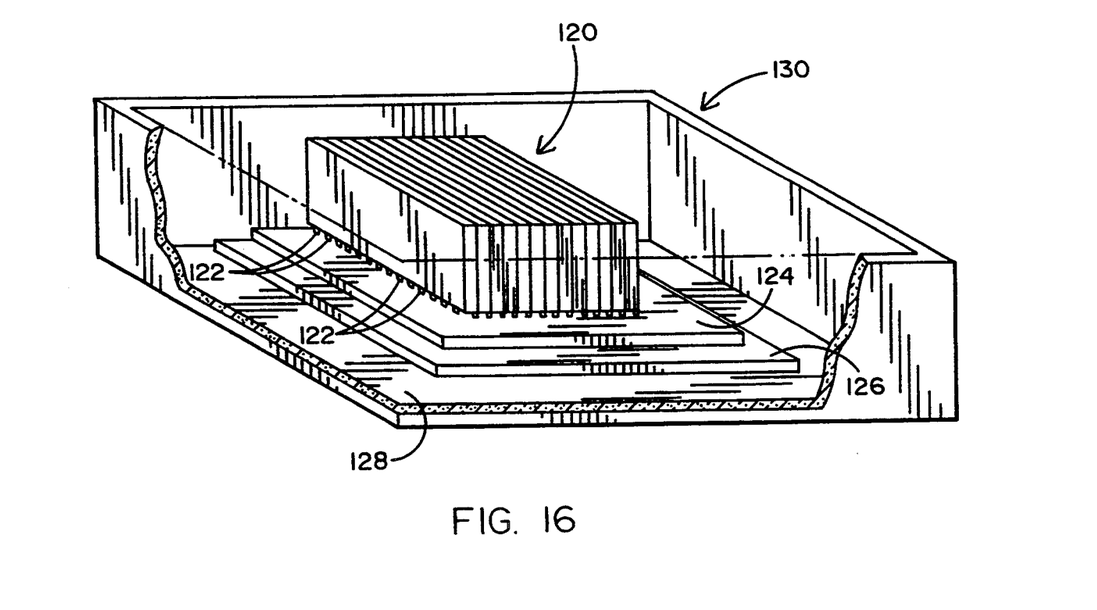
FIGS. 16 and 17 show a packaged microprocessor/memory stack, of the type shown in FIG. 3, as it would be structured for the purpose of thermal analysis.
Figure 17:
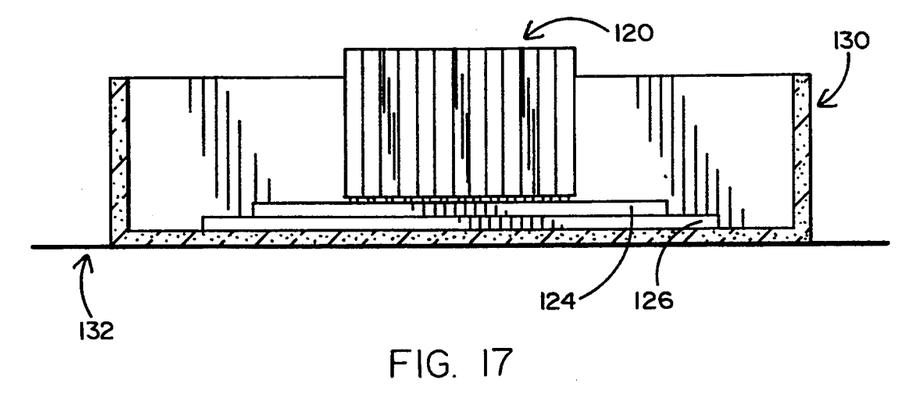

Heat dissipation is the first problem which comes to mind. In the construction shown thus far, the heat generated in the memory stack is conducted through the microprocessor. FIGS. 16 and 17 are used to illustrate a thermal analysis structure used in testing a "worst case" scenario. A thermal analysis of such a scenario was conducted by simulation, using the SINDA model, a NASA-developed thermal analysis software simulation.

In FIG. 16, which is based on the arrangement of FIG. 3, a memory stack 120 is secured by solder bumps 122 to a silicon wiring substrate 124. The substrate 124 is glued to a microprocessor chip 126, which in turn is glued to the floor 128 of a package container 130. In FIG. 17, the entire package is mounted on a heat sink 132, which might be a PC board.

In the SINDA analysis, the model assumed a stack of memory chips solder bumped to a silicon substrate, which was attached directly to an iWarp processor chip, as shown in FIGS. 16 and 17. The iWarp processor chip was expected to increase in temperature in a 3D package; the temperature rise was estimated to be 10° C. For the purposes of this thermal model, the memory stack was assumed to consist of 92 memory chips, each 0.5 inches square. Of these, 80 memory chips were assumed to be active, while the 6 on each end of the stack were assumed to be inactive. The active and inactive chips are the same, except that the inactive chips dissipate no heat. The silicon substrate was assumed to be 0.8 inches square, and the microprocessor die was assumed to be 1.0 inch square. The memory chips were assumed to be 6 mils thick silicon, while both the substrate and the processor chip base were assumed to be thinned to 20 mils of silicon. The memory chips were bonded to the substrate using 27 bumps for every 2 memory chips, 25 of which were 5 mils square, and 2 of which were 10×5 mils. An infinite heat sink was assumed below the processor chip, and it was held at 35° C. Suitable thermal conductivity values were assumed for all materials, including the solder bumps, the silicon substrate, and the epoxy used to secure the substrate to the microprocessor chip.

The test results showed that, for a heat sink temperature of 35° C., the maximum memory chip temperature will be between 75° C. and 85° C. for a typical memory die. The power dissipation is the sum of that of the processor chip and the memory stack. The memory stack power is dominated, with the latest chips, by the active power which is determined by the data word width and memory architecture. A typical iWarp memory, assuming 10 chips turned on at a time, would consume 7.5 watts to go with the microprocessor's own 7 watts, for a total of almost 15 watts. An AMT DAP device, on the other hand, can use a slower SRAM or a low power DRAM at 350 miliwatts. With its 75 bit wide word, 9 chips would be turned on, consuming 3 watts, which combines with the processor's 1.5 watts for less than 5 watts per package.

The foregoing examples are based on the very high performance required in the NASA SOBIEC program. Other situations would have much lower power and heat dissipation. Furthermore, the memory stacks are capable of an order of magnitude higher speed owing to the inherently low inductance and capacitance of 3D packaging. Because of the low inductance, the noise due to ringing will be so much lower that the memory chips could be operated at much lower voltages with an associated drop in power.

In addition, the microprocessor/memory stack combination disclosed in this application reduces so significantly the signal traveling distances that the power requirements for memory operation could be substantially reduced. Typically the memories run at 5 volts. They might be reduced to 3 or 2 or even 1 volt. The power varies as the square of that number. So a factor of 2 in voltage reduction would result in a factor of 4 in power reduction. And power reduction can be used to obtain heat reduction. The reduction in power requirements in the system can be used either to increase speed, or to reduce power, or to obtain some combination of both advantages.

Dimensional considerations are also relevant to this disclosure. In almost all situations the area of the microprocessor chip is large enough to provide mounting space for the memory stack. The iWARP microprocessor chip (FIG. 1) is about 550 mils square. The nCUBE microprocessor chip (FIG. 2) is slightly smaller.

Each memory chip is about one-half inch x one-fourth inch. The reason for the larger dimension in one direction is the rerouting, as disclosed in U.S. Pat. No. 5,104,820, of the chip leads to bring all leads to the same edge. This rerouting is done while the dice are part of a single wafer. Each single chip cut from a wafer prior to the chip stacking process is about twice as wide as it is deep. This relationship is apparent both in the "sliced bread" stacks (FIGS. 3, 6, 9, and 10) and in the "pancake" stacks (FIGS. 13, 14, and 15). As the memory stacks made from available wafers are subjected to continuing experiments and improvements, their width dimension tends to be reduced to, say, 400 mils. Since the width of the ledge needed around the chip stack can be as low as 10 mils, there is generally no dimensional problem in mounting a memory stack on a microprocessor chip.

Figure 18:
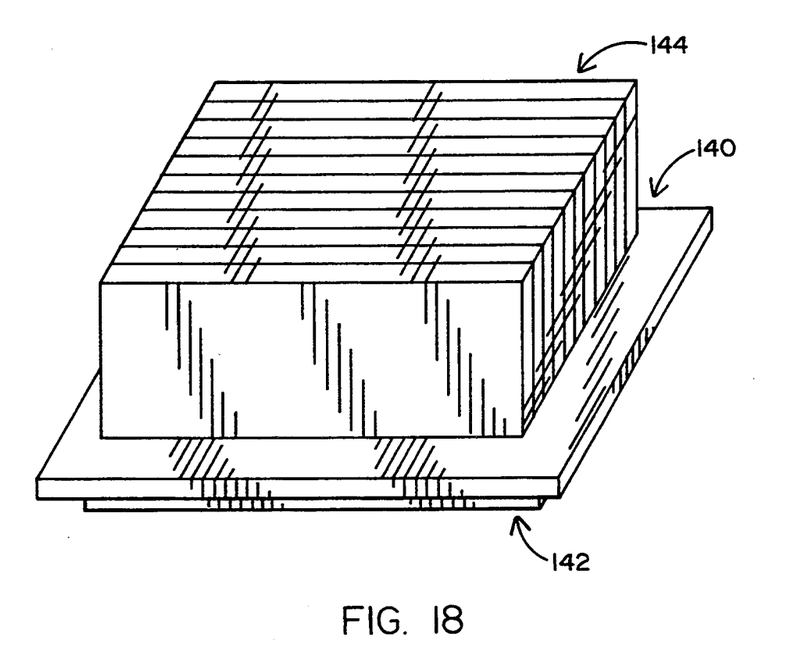
FIG. 18 shows a module in which a substrate carries a microprocessor on one side and a memory stack on the other.

However, if the stack dimensions are greater than the microprocessor area dimensions, a solution of the problem would be to use an intermediate substrate, which is larger than either the memory stack or the microprocessor. FIG. 18 shows a module having a substrate 140, which is secured both to a microprocessor 142 mounted on one side of the substrate, and to a "sliced bread" memory stack 144 mounted on the other side of the substrate. Holes, or vias, extend through the substrate 140, through which metallic leads extend in order to electrically interconnect terminals on the microprocessor to terminals on the access plane of the memory stack. Because of the need for forming vias and extending leads through the substrate, a dielectric material, such as aluminum nitride, is preferred over a silicon substrate covered by dielectric material.

As stated above, the concept of providing a module in which a stack of memory chips is secured to the microprocessor chip served by the memory resulted from a search for an answer to the problem of combining multiple computer functions in a minimum space. Various possible combinations were considered and discarded. When the concept disclosed in this application was conceived, possible problems were analyzed and tests were conducted to determine feasibility. Not only was feasibility established, but benefits far exceeding expectations were experienced.

It was found that placing the memory on top of the processor and in the same package minimizes the line lengths, the number of wiring/interconnect junctions, and inductance and capacitance between the processor and the memory. This is especially true in the preferred embodiment, where the stack is bump bonded to the processor die, thus eliminating wire bond or TAB traces and bond junctions. There are several positive effects which result from this densification:

(a) Signal propagation speed is maximized (i.e., propagation delay is minimized) due to shorter line lengths and minimized line capacitance.

(b) Allowable signal frequency is increased due to minimization of line inductance and thus the minimization of ringing and reflection (transmission line effects). This minimizes signal settling time and thus maximizes the allowable clock frequencies while minimizing access times.

(c) Power utilization is decreased due to the minimization of line capacitance. Since there is less line capacitance to charge, less current and therefore less power is required to charge it.

(d) Reliability is increased due to the reduction of power dissipation and the reduction of interconnect junctions. The primary cause of unreliability in state of the art electronics is failure of bonds and other interconnect junctions. By eliminating most of these junctions, reliability is greatly increased. The second most likely cause of failure is stress due to power dissipation and the resultant thermal stress. By minimizing the power dissipated in the highest power portion of the component (i.e., the buffer drivers), which is also the most likely failure point in ICs, both component and system reliability are greatly improved.

Additional enhancements/advantages are possible if the processor and memory ICs are designed to take advantage of using a 3D IC stack mounted on the processor. The new design would use new, smaller, lower power, faster I/O buffer drivers and internal circuitry. This would require a new I/O buffer/driver design and a new low voltage/ low power digital logic family. Reasoning behind this enhancement includes the following:

Reduced line capacitance results in reduced drive levels in the processor and memory I/O buffer drivers.

Reduced drive in the I/O results in lower I/O noise levels and thus improved signal-to-noise ratio.

The reduced current surges (from reduced I/O drive levels) reduces "ground bounce" effects.

Placement of the ICs within the same package and in physical proximity results in low thermal gradients between the ICs and thus minimizes thermally induced threshold and signal level differences between the ICs.

Similarly, due to the closeness, VCC and ground potentials between ICs is minimized.

The reduced noise, ground bounce, temperature and voltage differentials enhance signal-to-noise ratio.

Better signal-to-noise ratio allows reduction in I/O signal swings (both voltage and current), thus further reducing this source of noise, and reducing signal transition time.

Similarly, reduction of the noise environment allows the reduction of on-chip operating voltages and/or currents (i.e., on-chip signal swings). This reduces on-chip power/thermal dissipation and improves signal speed (transition time and propagation delays).

The results of all of these reductions in power and signal swing are: improved processor throughput, both due to on-chip speed increase and inter-chip propagation time reduction; improved reliability due to reduced power/thermal dissipation, and therefore reduced junction temperatures and semiconductor stress levels; and improved thermal management, i.e., easier heat removal due to the fact that there is less heat to remove.

At the system level, this results in: higher throughput, fewer components (since more circuitry can now be put on a board). This densification results in fewer boards, smaller backplanes, fewer cables, and thus fewer bus drivers and bus interface ICs), less physical structure, less thermal management equipment, and less power supply/conditioning equipment. The ultimate result is higher performance at lower cost.

While the benefits of the approach are applicable to any computing system, there are some systems on which the impact will be most strongly felt. These include: portable and hand held systems; space based systems; avionics systems; high reliability systems; medical equipment, especially portable, highly reliable and implantable systems; robotics (where there is a need to incorporate the electronics on the robot itself); and wearable systems (computers and electronics embedded either in or on clothing, suits and helmets).

From the foregoing description, it will be apparent that the structures and methods disclosed in this application will provide the significant functional benefits summarized in the introductory and summary portions of the specification.

The following claims are intended not only to cover the specific embodiments disclosed, but also to cover the inventive concepts explained herein with the maximum breadth and comprehensiveness permitted by the prior art.

What is claimed is:

1. A computer module comprising:

an integrated circuit microprocessor chip containing computer circuitry:

a stack of glued together integrated circuit memory chips, each containing memory circuitry dedicated to the computer module;

terminals formed on the microprocessor chip, including memory-interface terminals connected to the computer circuitry contained in the microprocessor chip;

the stack of memory chips having a planar access surface to which an array of spaced electrical leads extend from the memory circuitry;

means for electrically connecting each memory-interface terminal on the microprocessor chip to at least one of the leads at the access surface of the stack of memory chips; and means for structurally integrating the stack of memory chips and the microprocessor chip to constitute a computer module.

2. The computer module of claim 1 which includes:

a plurality of solder bumps which provide both structural connection of the stack of memory chips to the microprocessor chip and also electrical connection between microprocessor memory-interface terminals and the electrical leads at the access surface of the stack of memory chips.

3. The computer module of claim 2 which includes:

separate electrical leads on the microprocessor chip surface which extend from the terminals electrically connected to the solder bumps to separate memory-interface terminals formed on the microprocessor chip.

4. The computer module of claim 2 which includes:

a substrate, one side of which is connected by the solder bumps to the access surface of the stack of memory chips, and the other side of which is glued to the microprocessor chip.

5. The computer module of claim 4 which includes:

terminals formed near the edge of the flat substrate on the side which is connected to the stack of memory chips;

spaced electrical leads connected to and extending from said terminals to those solder bumps which provide electrical connection to the electrical leads at the access surface of the stack of memory chips; and a plurality of wire bonds each connected between one of the terminals on the substrate and one of the memory-interface terminals on the microprocessor chip.

6. The computer module of claim 2 in which:

the terminals formed on the microprocessor chip include terminals which are aligned with and electrically connected to the solder bumps.

7. The computer module of claim 6 in which:

the terminals formed on the microprocessor chip which are aligned with and electrically connected to the solder bumps are the sole memory-interface terminals of the microprocessor chip.

8. The computer module of claim 1 in which:

the memory chips in the stack lie in planes perpendicular to the microprocessor chip.

9. The computer module of claim 1 in which:

the memory chips in the stack lie in planes parallel to the microprocessor chip.

10. The computer module of claim 9 which includes:

a top layer in the stack of memory chips which provides an exposed surface having a plurality of terminals, each electrically connected to at least one of the array of spaced electrical leads at the access surface of the stack.

11. The computer module of claim 10 which includes:

wire bonds each connecting one of the terminals on the top layer of the stack to one of the memory-interface terminals formed on the microprocessor chip.

12. The computer module of claim 9 which includes:

a layer in the stack of memory chips which is adjacent to the microprocessor chip, and which has terminals on its surface, each electrically connected to at least one of the array of spaced electrical leads at the access surface of the stack.

13. The computer module of claim 12 which includes:

solder bumps electrically connecting individual terminals on the adjacent layer of the stack to individual memory-interface terminals on the microprocessor chip.

14. The computer module of claim 13 in which:

the terminals on the microprocessor chip are aligned with the terminals on the adjacent layer of the stack and are directly soldered thereto.

15. The computer module of claim 14 in which the terminals on the microprocessor chip soldered to the terminals on the adjacent layer of the stack are the sole memory-interface terminals of the microprocessor chip.

16. The computer module of claim 14 which includes:

separate electrical leads on the microprocessor chip surface which extend from the terminals electrically connected to the solder bumps to separate memory-interface terminals formed on the microprocessor chip.

17. The computer module of claim 1 which includes:

a substrate formed of dielectric material having a plurality of vias extending therethrough;

means for securing the stack of memory chips to one surface of the substrate;

means for securing the microprocessor chip to the opposite surface of the substrate; and electrical connections extending through the vias to separately connect memory-interface terminals on the microprocessor chip to at least one of the electrical leads at the access surface of the stack of memory chips.

18. The computer module of claim 1 in which:

the integrated circuitry in the microprocessor chip is designed to perform its necessary functions at the lower power and higher speed in the integrated computer module.

19. The computer module of claim 18 in which:

the integrated circuitry in the memory stack is designed to perform its necessary functions at the lower power and higher speed in the integrated computer module.

20. The computer module of claim 1 in which:

the integrated circuitry in the memory stack is designed to perform its necessary functions at the lower power and higher speed in the integrated computer module.

21. A method of fabricating a computer module, comprising;

providing an integrated circuit microprocessor chip containing computer circuitry and having a plurality of terminals connected to its computer circuitry, including memory-interface terminals;

providing a glued together stack of integrated circuit memory chips having electrical leads extending to an access surface of the stack;

structurally integrating the stack and the microprocessor chip to constitute a computer module; and electrically connecting the memory-interface terminals of the microprocessor chip to the electrical leads at the access surface of the stack.

22. The method of claim 21 in which:

the stack is secured to the microprocessor chip by a plurality of solder bumps which provide both electrical and mechanical interconnection.

23. The method of claim 22 in which:

metallic conductors are placed on the access surface of the stack in such a way as to form T-connections with the electrical leads;

solder bumps are formed on the metallic conductors located on the access surface of the stack;

the electrical memory-interface terminals on the microprocessor chip are so located as to align with the solder bumps; and the stack and microprocessor chip are interconnected by means of the solder bumps.

24. The method of claim 21 which includes the step of:

redesigning the integrated circuitry in the microprocessor chip to perform its necessary functions at the lower power and higher speed in the integrated computer module.

25. The method of claim 24 which includes the steps of:

redesigning the integrated circuitry in the memory stack to perform its necessary functions at the lower power and higher speed in the integrated computer module.

26. The method of claim 21 which includes the step of:

redesigning the integrated circuitry in the memory stack to perform its necessary functions at the lower power and higher speed in the integrated computer module.

* * * * *

UNITED STATES PATENT AND TRADEMARK OFFICE
CERTIFICATE OF CORRECTION

PATENT NO. : 5,347,428
APPLICATION NO. : 07/985837
DATED : September 13, 1994
INVENTOR(S) : John C. Carson et al.

It is certified that error appears in the above-identified patent and that said Letters Patent is hereby corrected as shown below:

Claim 1, Column 13, Line 4:
Delete the ":" after the word "circuitry" and replace it with a --;--.

Claim 5, Column 13, Line 41:
Delete the word "flat" before the word "substrate".

Claim 21, Column 14, Line 64:
Delete the ";" after the word "comprising" and replace it with a --:--.

Signed and Sealed this

Sixth Day of July, 2010

David J. Kappos
*Director of the United States Patent and Trademark Office*